(12) United States Patent
Thiruvengadam et al.

(10) Patent No.: US 9,454,427 B2
(45) Date of Patent: *Sep. 27, 2016

(54) SHIFTING READ DATA

(71) Applicant: MICRON TECHNOLOGY, INC., Boise, ID (US)

(72) Inventors: Aswin Thiruvengadam, Mather, CA (US); Angelo Visconti, Appiano Gentile (IT); Mauro Bonanomi, Cassano D'Adda (IT); Richard E. Fackenthal, Carmichael, CA (US); William Melton, Shingle Springs, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/855,203

(22) Filed: Sep. 15, 2015

(65) Prior Publication Data

US 2016/0004595 A1   Jan. 7, 2016

Related U.S. Application Data

(60) Division of application No. 14/612,103, filed on Feb. 2, 2015, now Pat. No. 9,176,831, which is a continuation of application No. 13/779,381, filed on Feb. 27, 2013, now Pat. No. 8,977,929.

(51) Int. Cl.
*G11C 29/00* (2006.01)
*G06F 11/10* (2006.01)
*G06F 11/16* (2006.01)
*G06F 11/07* (2006.01)
*G06F 3/06* (2006.01)
*G11C 7/10* (2006.01)
*G11C 13/00* (2006.01)
*G11C 16/10* (2006.01)
*G11C 19/00* (2006.01)

(52) U.S. Cl.
CPC .......... *G06F 11/1008* (2013.01); *G06F 3/064* (2013.01); *G06F 3/0619* (2013.01); *G06F 3/0644* (2013.01); *G06F 3/0673* (2013.01); *G06F 3/0679* (2013.01); *G06F 11/0751* (2013.01); *G06F 11/1048* (2013.01); *G06F 11/1666* (2013.01); *G11C 7/1006* (2013.01); *G11C 7/1012* (2013.01); *G11C 13/0004* (2013.01); *G11C 13/0069* (2013.01); *G11C 16/10* (2013.01); *G11C 19/00* (2013.01)

(58) Field of Classification Search
CPC .......... G06F 11/1008; G06F 11/1666; G06F 11/0751; G06F 11/1046; G06F 3/0619; G06F 3/0644; G06F 3/0673
See application file for complete search history.

(56) References Cited

U.S. PATENT DOCUMENTS 4,887,268 A   12/1989  Tohara
5,761,217 A   6/1998   Soumiya et al.

(Continued)

*Primary Examiner* — Sam Rizk
(74) *Attorney, Agent, or Firm* — Holland & Hart LLP

(57) ABSTRACT

This disclosure relates to avoiding a hard error in memory during write time by shifting data to be programmed to memory to mask the hard error. In one implementation, a method of programming data to a memory array includes obtaining error data corresponding to a selected memory cell, shifting a data pattern such that a value to be stored by the selected memory cell matches a value associated with a hard error, and programming the shifted data pattern to memory array such that the value programmed to the selected memory cell matches the value associated with the hard error.

20 Claims, 10 Drawing Sheets

(56) References Cited

U.S. PATENT DOCUMENTS

| | | |
|---|---|---|
| 5,832,031 A | 11/1998 | Hammons, Jr. |
| 6,453,440 B1 | 9/2002 | Cypher |
| 7,178,088 B2 | 2/2007 | Hashimoto et al. |
| 8,185,802 B2 | 5/2012 | Noguchi |
| 8,291,283 B1 | 10/2012 | Rad et al. |
| 8,977,929 B2 | 3/2015 | Thiruvengadam et al. |
| 9,176,831 B2 | 11/2015 | Thiruvengadam et al. |
| 2002/0097613 A1 | 7/2002 | Raynham |
| 2013/0132798 A1 | 5/2013 | Jeon et al. |
| 2014/0245107 A1 | 8/2014 | Thiruvengadam et al. |

| Physical location | Bit 10 | Bit 9 | Bit 8 | Bit 7 | Bit 6 | Bit 5 | Bit 4 | Bit 3 | Bit 2 | Bit 1 | Bit 0 |
|---|---|---|---|---|---|---|---|---|---|---|---|
| Error | 1 | 1 | 1 | 0 | 0 | 0 | 0 | 0 | 0 | 0 | 0 |
| Stuck at | 1 | 1 | 0 | #N/A | #N/A | #N/A | #N/A | #N/A | #N/A | #N/A | #N/A |
| Data | 0 | 0 | 1 | 1 | 1 | 0 | 0 | 1 | 0 | 1 | 1 |
| <<1 | 0 | 1 | 1 | 1 | 0 | 0 | 1 | 0 | 1 | 1 | 1 |
| <<1 | 1 | 1 | 0 | 0 | 0 | 1 | 0 | 1 | 1 | 1 | 0 |
| <<1 | 1 | 1 | 0 | 0 | 1 | 0 | 1 | 1 | 1 | 0 | 0 |

Shifting Data to Hide Errors

*FIG. 2A*

| | Bit 10 | Bit 9 | Bit 8 | Bit 7 | Bit 6 | Bit 5 | Bit 4 | Bit 3 | Bit 2 | Bit 1 | Bit 0 |
|---|---|---|---|---|---|---|---|---|---|---|---|
| Error | 0 | 0 | 0 | 0 | 0 | 1 | 0 | 0 | 0 | 0 | 0 |
| Stuck at | #N/A | #N/A | #N/A | #N/A | #N/A | 1 | #N/A | #N/A | #N/A | #N/A | #N/A |
| Data | 0 | 1 | 1 | 0 | 1 | 1 | 0 | 0 | 1 | 0 | 0 |
| NewData | 0 | 1 | 1 | 0 | 1 | 1 | 0 | 0 | 1 | 0 | 0 |

No shift required

FIG. 2B

| | Bit 10 | Bit 9 | Bit 8 | Bit 7 | Bit 6 | Bit 5 | Bit 4 | Bit 3 | Bit 2 | Bit 1 | Bit 0 |
|---|---|---|---|---|---|---|---|---|---|---|---|
| Error | 0 | 0 | 0 | 0 | 0 | 1 | 0 | 0 | 0 | 0 | 0 |
| Stuck at | #N/A | #N/A | #N/A | #N/A | #N/A | 1 | #N/A | #N/A | #N/A | #N/A | #N/A |
| Data | 1 | 1 | 1 | 1 | 0 | 0 | 0 | 1 | 1 | 0 | 1 |
| NewData | 1 | 1 | 1 | 0 | 0 | 1 | 1 | 0 | 1 | 1 | 1 | shift left by 2

FIG. 2C

| | Bit 10 | Bit 9 | Bit 8 | Bit 7 | Bit 6 | Bit 5 | Bit 4 | Bit 3 | Bit 2 | Bit 1 | Bit 0 |
|---|---|---|---|---|---|---|---|---|---|---|---|
| Error | 0 | 0 | 1 | 0 | 0 | 0 | 0 | 0 | 0 | 1 | 0 |
| Stuck at | #N/A | #N/A | 1 | #N/A | #N/A | #N/A | #N/A | #N/A | #N/A | 0 | #N/A |
| Data | 0 | 0 | 1 | 1 | 0 | 1 | 1 | 0 | 0 | 1 | 1 |

Not all errors are fixed

Reading Cyclic Codes

| Bit 10 | Bit 9 | Bit 8 | Bit 7 | Bit 6 | Bit 5 | Bit 4 | Bit 3 | Bit 2 | Bit 1 | Bit 0 | Shift |
|---|---|---|---|---|---|---|---|---|---|---|---|
| 1 | 1 | 0 | 0 | 1 | 0 | 1 | 1 | 1 | 0 | 0 | 3 |
| 1 | 1 | 0 | 0 | 1 | 0 | 1 | 1 | 1 | 0 | 0 | |
| 1 | 0 | 0 | 1 | 1 | 0 | 0 | 1 | 0 | 1 | 1 | |

ECC Engine: For Cyclic Codes, Data is Valid Regardless of Shifting

FIG. 3B

Reading Non-Cyclic or Cyclic Codes

| Bit 10 | Bit 9 | Bit 8 | Bit 7 | Bit 6 | Bit 5 | Bit 4 | Bit 3 | Bit 2 | Bit 1 | Bit 0 | Shift |
|---|---|---|---|---|---|---|---|---|---|---|---|
| 1 | 1 | 0 | 0 | 1 | 0 | 1 | 1 | 1 | 0 | 0 | 3 |
| 1 | 0 | 0 | 1 | 1 | 0 | 0 | 1 | 0 | 1 | 1 | |
| 1 | | | 1 | 1 | 0 | 0 | 1 | 0 | 1 | 1 | |

ECC Engine

SHIFTING READ DATA

CROSS REFERENCE TO RELATED APPLICATIONS

This application is a divisional of U.S. patent application Ser. No. 14/612,103, filed Feb. 2, 2015, titled "REARRANGING PROGRAMMING DATA TO AVOID HARD ERRORS," which is a continuation of U.S. patent application Ser. No. 13/779,381, filed Feb. 27, 2013, titled "REARRANGING WRITE DATA TO AVOID HARD ERRORS," issued as U.S. Pat. No. 8,977,929 on Mar. 10, 2015. The disclosures of each of these prior applications are hereby incorporated by reference in their entireties herein.

BACKGROUND

1. Technical Field

Embodiments of the invention generally relate to electronics, and, in particular, to memory devices.

2. Description of the Related Technology

Certain errors can repeatedly occur when writing data to memory. For instance, memories can encounter "hard errors" in memory cells. A hard error can refer to a repeatable error that consistently returns incorrect data. Some hard errors can result from a memory cell getting stuck in a particular state. As one example, a binary memory cell with a hard error can return a logical 0 value regardless of whether a logical 0 or a logical 1 is written to the memory cell. In this example, the memory cell with the hard error encounters the same failure when reading data from the memory cell. More specifically, a memory cell stuck in a logical 0 state will encounter failures of reading a logical 0 when trying to read a logical 1 written to the memory cell.

Hard errors can occur in various types of memories, such as phase-change memory (PCM), also known as PCRAM or PRAM. PCM is a form of non-volatile memory made from a phase-change material. An example of a phase-change material is Germanium-Antimony-Tellurium (GST). When a cell of GST material is heated beyond its melting point and cools relatively rapidly, the phase-change material of the cell is in an amorphous state and can have a resistance associated with a first state, such as logic 0. When the cell of GST material is heated and is cooled relatively slowly, the phase-change material of the cell is in a crystalline state and can have a resistance associated with a second state, such as logic 1. The cell of GST material can also be heated to a relatively lower temperature, such as a temperature associated with crystallization to achieve the crystalline state. Intermediate states are also possible for multi-level cells.

Accordingly, a need exists for correcting for hard errors in memories, such as PCMs.

BRIEF DESCRIPTION OF THE DRAWINGS

These drawings and the associated description herein are provided to illustrate specific embodiments of the invention and are not intended to be limiting.

FIGS. 2A-2D illustrate examples of shifting data to be written to memory to hide hard memory errors according to various embodiments.

FIG. 3A illustrates an example of reading circularly shifted data from a memory according to an embodiment.

FIG. 3B illustrates an example of reading non-circularly shifted or circularly shifted data from a memory according to an embodiment.

To avoid repetition of description, components having the same or similar function may be referenced by the same reference number.

DETAILED DESCRIPTION OF CERTAIN EMBODIMENTS

Although particular embodiments are described herein, other embodiments, including embodiments that do not provide all of the benefits and features set forth herein, will be apparent to those of ordinary skill in the art.

As discussed above, memories can encounter hard errors. Such hard errors can be corrected when writing data to a memory array. Correcting hard errors can benefit memory devices that encounter a relatively large amount of write time failures. Alternatively or additionally, correcting hard errors can benefit memory devices with demanding specifications for extended endurance.

A relatively common endurance failure mechanism in some types of memories, such as PCMs, is having certain memory cells stuck in a particular logical state. Due to the bit alterability feature of PCMs, the principles and advantages described herein can be applied more easily to PCM than some other types of memories, such as NOR or NAND flash memories, in some applications.

To correct a hard error, data to be written to memory can be adjusted for writing to the memory by using additional data available during write time. The additional data can include information identifying whether or not a memory cell has a hard error and information identifying a value associated with the hard error, if any. In certain situations, avoidance of hard errors during write time can be more powerful than performing error correction using error correction codes (ECC) on data read from memory. Further, hard errors can be avoided during write time, and data read from the memory can later be corrected via error correction as well.

Figure 1A:
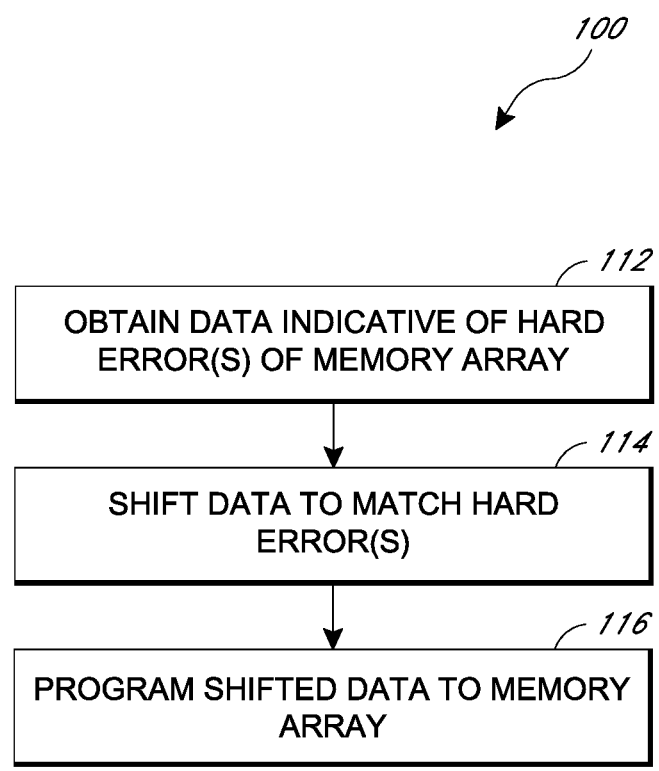
FIG. 1A is a flow diagram of an illustrative method of programming data to a memory according to an embodiment.

FIG. 1A is a flow diagram of an illustrative method 100 of programming data to a memory. The data to be written or programmed to memory can include user data, such as a data portion of a codeword. A codeword can include a data portion and its corresponding ECC parity symbols for error correction. In some implementations, the data to be written to memory can include shift data identifying an amount by which user data written to memory is shifted. Parity data associated with the user data and/or the shift data can also be written to memory. The method can include obtaining error data indicative of one or more hard errors corresponding to selected memory cells of the memory array and corresponding values associated with the one or more hard errors at block 112. In one embodiment, the error data can be stored in memory can subsequently accessed during one or more additional write operations. In this way, error data can be generated and reused for multiple write operations. Each hard error can correspond to a selected memory cell of the memory array. The value associated with the hard error can identify a logical state at which the selected memory cell is stuck. For example, the selected memory cell can be a binary memory cell in the top right corner of the memory array that is stuck at a logical value of 0. In this example, the information indicative of the hard error can indicate that the selected memory cell at the top right corner of the memory array has a hard error and the information identifying the value associated with the hard error can correspond to a logical 0. Such error data can be obtained from a separate die or integrated circuit. Alternatively, a die or integrated circuit on which the memory with the hard error is embodied can generate such error data. More detail will be provided regarding generating error data with reference to FIG. 1B.

At block 114, the write data can be shifted to match the one or more hard errors. As used herein, the term "shift" refers to rearranging a data pattern. While the examples provided herein may be described in the context of shifting data digits to adjacent positions in a data pattern for illustrative purposes, shifting as used herein can refer to any reassignment of data digits within a data pattern. As such, the principles and advantages described herein can be applied to any reassignment of data digits in a data pattern to match one or more hard errors in a memory.

In certain embodiments, the write data can be circularly shifted. For example, in the context of bits for digits, a circular shift can correspond to a bitwise rotation. A circular shift means that digits that are shifted out of a string at one end are shifted back into the string at the other end. A circular shift can alternatively be referred to as a cyclic shift. The write data can be shifted right and/or shifted left, that is, either away from or towards the most significant bit. It will be understood that "right" and "left" are schematic representations and do not necessarily represent the physical directions of right and left on an integrated circuit. Write data can be shifted such that a value to be written to a selected memory cell of a memory array associated with a hard error matches the value associated with the hard error. In this way, the write data can then be written to the memory array such that a selected memory cell is stuck at a correct value corresponding to a digit of the write data to be written to the selected memory cell. This can mask hard errors in the memory array. Some examples of shifting write data will be described later with reference to FIGS. 2A-2D.

After shifting the write data, the shifted write data can be programmed to the memory array such that the value written to the selected memory cell matches the value associated with the hard error at block 116. The shifting at block 114 and programming at block 116 can correct multiple hard errors at once. In this way, hard errors can be reduced during write time by programming particular patterns of write data to memory cells of the memory array.

Figure 1B:
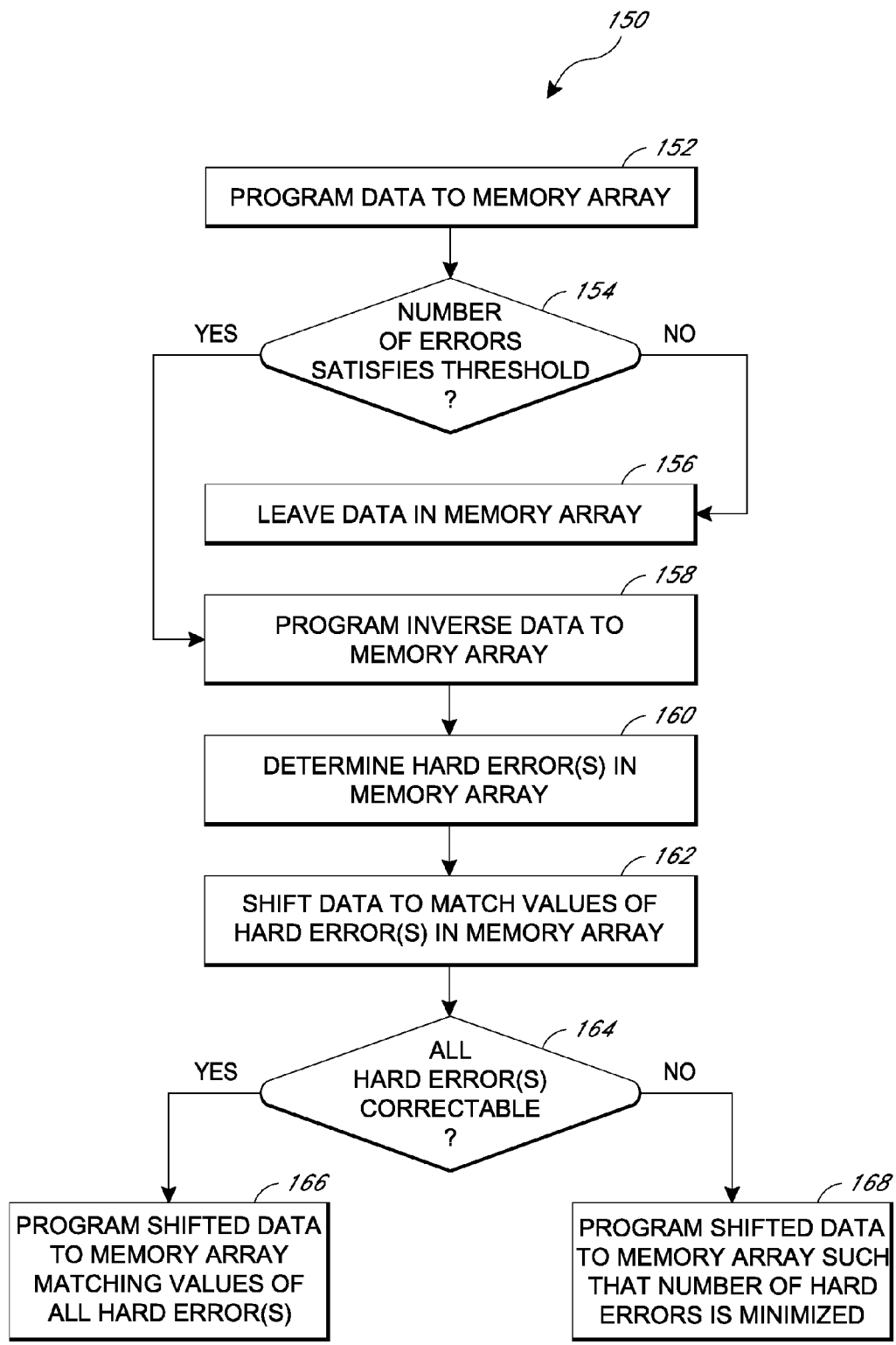
FIG. 1B is a flow diagram of another illustrative method of programming data to a memory according to an embodiment.

FIG. 1B is a flow diagram of another illustrative method 150 of programming data to a memory. The method 150 can include any combination of features of the method 100. The method 150 can include additional operations compared to the method 100, such as generating error data, determining whether to correct hard errors, determining whether all hard errors are correctable, or any combination thereof.

The method 150 can include determining hard errors and values associated with the determined hard errors. In one embodiment, hard errors can be determined prior to each write operation. According to some embodiments, hard errors can be determined and error data can be stored for use in one or more subsequent write operations. For instance, the operations at blocks 152-160 can be performed once for each write operation or performed once for multiple write operations. At block 152, write data can be programmed to a memory array. For example, a codeword or other string of digits can be written to selected memory cells of the memory array. The data programmed to the memory array can then be read back from the memory array and compared with the values expected to be stored in memory array. This reading back of programmed data is still part of the programming process. From such a comparison, errors in the data written to the memory array can be determined.

At block 154, the number of errors associated with programming a string of digits to the memory array can be compared to a threshold number of errors. When the number of errors is less than the threshold number of errors, it may not be worth correcting the errors during write time. For example, in some instances, error correction can be performed on data read from the memory array to reliably correct for less than the threshold number of errors. The threshold number of errors can be, for example, 2, 3, 4, 5, or more errors according to certain embodiments. The threshold number of errors can vary based on the size of the codewords and/or the desired error correction capability of the error correction code. When the number of errors is less than the threshold number of errors, the write data can be left in memory at block 156.

On the other hand, when the number of errors is greater than or equal to the threshold number of errors, the inverse of the write data can be programmed to the same locations of the memory array at block 158 as the write data was programmed to at block 152. Programming inverse data to the same locations of the memory array can assist in differentiating hard errors from soft errors. For instance, by programming inverse data to the same locations of the memory array, memory cells that are stuck at particular logic values can be identified. By using PCM or other bit alterable memories, no erase operation is needed before writing the inverse data to the memory cells. In certain implementations, the inverse data can be written to the same locations and then the non-inverse data can subsequently be written to the same memory locations again to assist in identifying hard errors and values associated with the hard errors. Writing data and inverse data can be iterated any suitable number of times to assist in identifying hard errors. In an alternative embodiment, test data patterns can be written, such as patterns of all 0s or all 1s, to help uncover hard errors.

Hard errors associated with selected locations of the memory array can then be determined at block 160. For instance, when both binary values are sequentially attempted to be written to a selected memory cell configured to store binary values, a hard error can occur when there is an error associated with only one of the binary values intended to be written to the memory cell. As one example, when a selected memory cell is stuck at logic 1, then a logic 1 will be read out after a logic 1 or a logic 0 is attempted to be written to the selected memory cell. In this example, reading a logic 1 after both a logic 1 and a logic 0 is attempted to be written to the selected memory cell, can indicate that the selected memory cell is stuck at logic 1. Error data indicating that the selected memory has a hard error and the value associated with the hard error can then be used to correct the hard error.

At block 162, write data can be shifted to match values of one or more hard errors in the memory array. Shifting write data can include any combination of features described earlier with reference to block 114 of the method 100. Some examples of shifting data will now be described with reference to FIGS. 2A-2D. In these figures, "Data" refers to unshifted data to be written to physical non-volatile memory cells and "New Data refers to shifted data to be written to the same physical non-volatile memory cells. Additionally, in these figures, the "Error" and "Stuck At" data digits refer to data that is not stored in physical non-volatile memory cells of the memory array.

In the example shown in FIG. 2A, 11 binary memory cells can each store one bit of data. In the illustrated embodiment, the string for shifting is 11 bits long. However, other string lengths can be used. Each data bit of an 11 bit data string can be programmed to a corresponding one of the 11 memory cells. More specifically, bit 0 of the data string can be programmed to memory cell 0, bit 1 of the data string can be programmed to memory cell 1, etc. In one embodiment, these memory cells are phase change memory cells. Error data, which can be determined at block 160 or otherwise obtained, can include an error bit and a stuck at bit corresponding to each memory cell with a hard error in one embodiment. For instance, in FIG. 2A, memory cells 8, 9, and 10 have an error bit with a value indicating a hard error for each of these memory cells. The stuck at bit indicates a value at which the memory cell with the hard error is stuck. As shown in FIG. 2A, the stuck at bits indicate that memory cell 8 is stuck at a logic 0 value and memory cells 9 and 10 are stuck at a logic 1 value. The unshifted 11 bit data string of FIG. 2A can encounter an error in reading bit 9 when the unshifted 11 bit data string is programmed to memory, since the value of bit 9 (that is, logic 0) does not match the value that memory cell 9 is stuck at (that is, logic 1). The data string can then be shifted by one digit. For example, in FIG. 2A, the 11 bit data string is circularly shifted to the left by one bit. After the shift, the data bits to be programmed to the memory cells with hard errors can be compared to the stuck at bits to determine if the values of the data string match the values at which the memory cells are stuck. In some instances, the data string can be shifted one digit at a time until the hard errors match corresponding digits of the data string. After a left shift by 3 bits, the data digits to be programmed to memory cells 8, 9, and 10 match the values at which these memory cells are stuck. Thus, when the data string of FIG. 2A is shifted left by 3 bits and then programmed to memory, the hard errors will be masked. Since memory cells 0 to 7 are not stuck at particular logic values, either a logic 0 or a logic 1 can be programmed to these cells and read out correctly. Alternatively, the unshifted data string could be circularly shifted right by 2 digits to match the hard errors in this example.

In some instances, a data string need not be shifted. As shown by the example of FIG. 2B, when digit(s) of the data string initially match the value(s) at which memory element(s) are stuck at, no shifting is needed. In this example, since memory cell 5 is stuck at logic 1, no shift is needed to mask the hard error. As another example, when there are no hard errors in the memory cells that the data string is to be written to, then no shifting is needed. In one embodiment, the threshold comparison at block 154 can deal with the case where there are no hard errors in memory by causing the write data to remain in memory unshifted, in order to reduce unneeded processing.

FIG. 2C provides another example of shifting data to match a hard error in a memory cell. While the example of FIG. 2A shows that a data string can be shifted to match multiple hard errors, the example of FIG. 2C shows that in certain instances a data string can be shifted to correct a single hard error. As shown in FIG. 2C, an 11 digit data string can be circularly shifted left by 2 digits so that the new data pattern includes a data digit (that is, bit 5 in FIG. 2C) that matches a value associated with a hard error in a memory cell (that is, memory cell 5 being stuck at logic 1 in FIG. 2C). Alternatively, the unshifted data string could be circularly shifted right by 1 digit to match the hard error in memory cell 5 in this example.

In some instances, a data string cannot be circularly shifted to match all hard errors in the memory cells that data digits of data string are to be programmed to. For example, the 11 digit data string of FIG. 2D cannot be circularly shifted to match the hard errors in both memory cell 1 and memory cell 8. In cases where the data string cannot be circularly shifted to match all hard errors in the memory cells that data digits of data string are to be programmed to, other shifting can be implemented to correct for such hard errors.

Referring back to FIG. 1B, it can be determined whether all hard errors are correctable at block 164. For instance, when values of the data digits of a shifted data string to be programmed to selected memory cells match values associated with the hard errors in the selected memory cells, then all errors can be determined to be correctable. The examples of FIGS. 2A and 2C show shifted data strings that can correct for all hard errors of selected memory cells during write time. At block 166, after determining that all hard errors are correctable at block 164, a shifted data string can be programmed to selected memory cells such that values of the data digits programmed to memory match all hard error(s) in the memory cell(s). On the other hand, after determining that all of the hard error(s) cannot be corrected by shifting at block 164, data can be shifted to minimize the number of hard error(s) that will be encountered during read operations from the selected memory cells. For instance, if a string of digits is circularly shifted one digit at a time back to the original pattern of data without matching all values of hard errors, then all of the hard error(s) may be uncorrectable. At block 168, the shifted data can be programmed to the memory array such that the number of hard errors encountered during read operations are minimized. For instance, in the example shown in FIG. 2D where both of the hard errors cannot be corrected by circularly shifting, one of the two errors can be corrected by writing shifted data matching the one error to the memory array.

Shift data can identify an amount by which the data string was shifted prior to being programmed to the memory array. The shift data can also be stored in memory on either the same die or a different die than the data string. By storing the shift data, the data programmed to memory can be shifted back to reproduce the data string prior to shifting to mask hard errors. In some embodiments, the shift data can be parity protected. More detail regarding examples of parity protecting shift data will be provided later in connection with FIGS. 4 and 7.

FIGS. 3A and 3B illustrate examples of reading shifted data from memory. In FIGS. 3A and 3B, a cyclic code refers to an error correcting code for which a circular shifted right or left of any number of positions of any valid codeword results in another valid codeword. In FIG. 3B, a non-cyclic code refers to an error correcting code for which a circular shifted right or left of any number of positions of a valid codeword does not result in another valid codeword. FIG. 3A illustrates an example of reading circularly shifted data from a memory according to an embodiment. The data read from the memory array in FIG. 3A corresponds to the shifted data programmed to memory in the example of FIG. 2A. Because the data string was circularly shifted in FIG. 2A prior to being programmed to the memory array, the read data can be shifted back to the original pattern either before or after performing error correction. The data string was shifted by three digits in FIG. 2A. Accordingly, the stored shift data associated with the data string written to the memory array indicates a shift of 3 digits. In one embodiment, the data string is expected to be shifted in a certain direction (for example, left or right) and no data is needed to determine the direction of the shift. Error correction can be performed on the read data and then the read data can be shifted by the amount indicated by the shift data (that is, shifted left 3 places in the example shown in FIG. 3A). This can recover the original data string prior to being shifted and programmed to the array.

FIG. 3B illustrates an example of reading non-circularly shifted or circularly shifted data from a memory according to an embodiment. The data read from the memory array in FIG. 3B corresponds to the shifted data programmed to memory in the example of FIG. 2A with the exception that the data was not necessarily circularly shifted prior to being programmed to memory. In the case that the data was non-circularly shifted before being programmed to memory, the read data should be shifted back to the original pattern before performing error correction in one embodiment. In the example of FIG. 3B, the stored shift data associated with the data string programmed to the memory array indicates a shift of 3 digits. Error correction can be performed on the read data after the read data is shifted by the amount indicated by the shift data (for example, shifted left 3 places in the example shown in FIG. 3B) for data that was non-circularly shifted prior to being programmed to the memory. This can recover the original data string prior to being shifted and programmed to the array. For circularly shifted data, read data can be shifted and then error correction can be performed on the shifted read data to recover the original data string.

Figure 4:
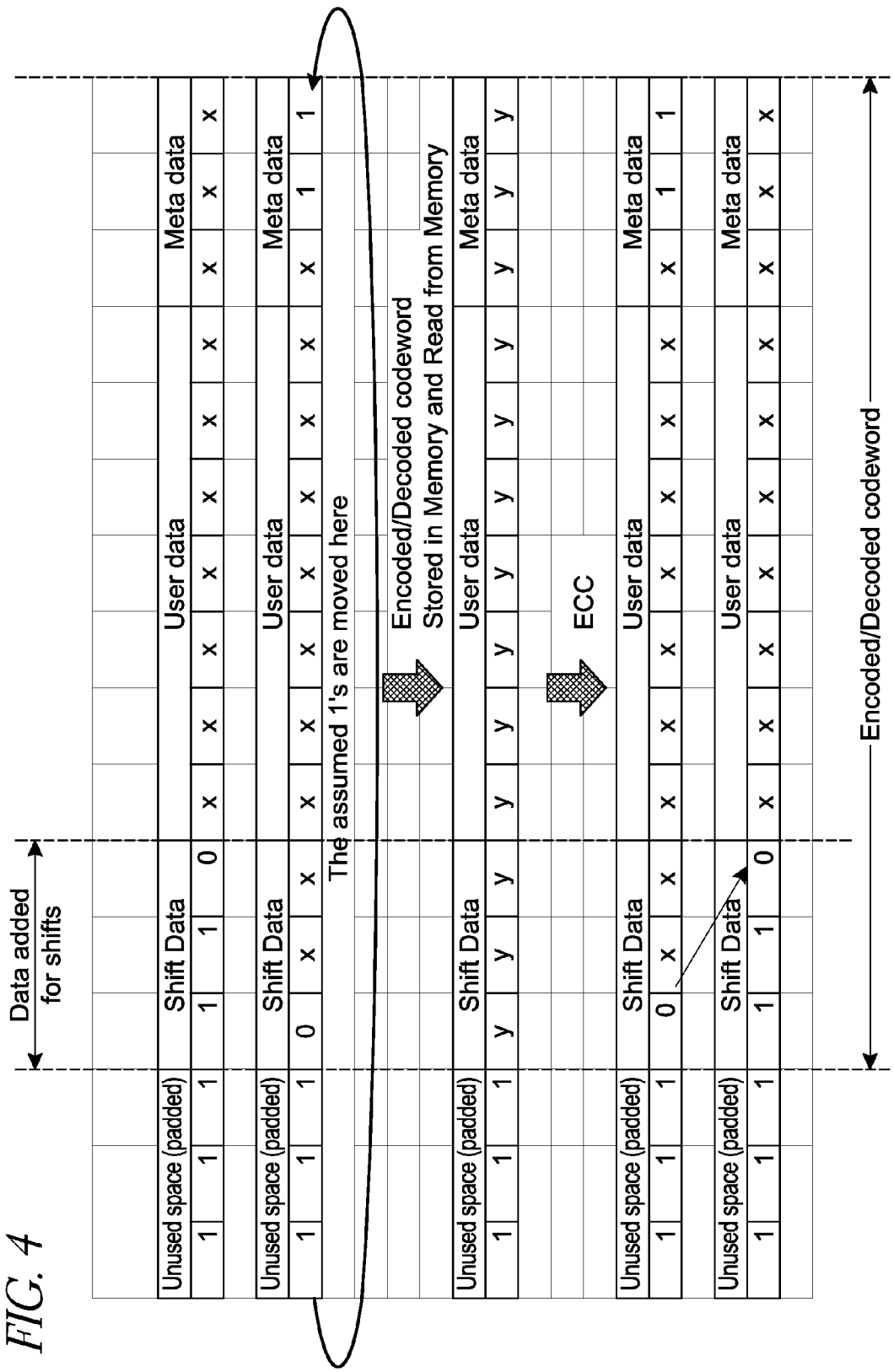
FIG. 4 illustrates an example of protecting shift data with BCH according to an embodiment.

FIG. 4 illustrates an example of protecting shift data with an internal error correction scheme according to an embodiment. In this example, a codeword can be padded at a transmit side and/or a receive side to aid in parity protecting its shift data. The codeword can be padded by adding leading "1s" as shown in FIG. 4. As another example, the codeword can be padded by adding leading "0s". Alternatively, the codeword can be padded by adding trailing "1s" or trailing "0s". The padded portion of the codeword need not be written to memory or read from memory. At least a portion of the codeword can be encoded and/or decoded. As illustrated, the encoded/decoded portion of the codeword can comprise shift data, user data, and meta data (for example, parity data for the user data). In FIG. 4, "x" represents the logical values of the user data and meta data portions of the codeword. For instance, an "x" can represent either a logic 0 or a logic 1 according to certain embodiments.

The codeword can be circularly shifted until the first digit of shift data proximate the padded data has a different value than digits of the padded data. In the example of FIG. 4, the codeword is circularly shifted left by two digits so that the encoded/decoded portion of the codeword has a value of logic 0 proximate the padded area of the codeword, which comprises leading 1s. In this way, the logic 0 can serve as a marker of an amount by which the codeword was shifted. Then encoded/decoded portion of the code word can be transmitted. The encoded/decoded portion can then be programmed to memory and subsequently read from memory, without the padded portion of the codeword being programmed to memory. This can avoid programmed extra padded bits to memory, thereby reducing complexity and saving power. Shift data identifying an amount by which the circularly shifted codeword was shifted prior to being programmed to memory can also be saved to memory.

When the encoded/decoded portion of the codeword is read from memory, it remains shifted. In FIG. 4, "y" represents the values of digits the shifted codeword read from memory at a receive side. For instance, an "y" can represent either a logic 0 or a logic 1 according to certain embodiments. The shifted data read from memory can be corrected by error correction. During error correction, the ECC decoding engine can assume that the digits of the padded portion of the codeword all include a particular value. For instance, in the example of FIG. 4, the ECC decoding engine can assume the digits of padded portion of the codeword all have values of logic 1. After error correction, the values of digits of the shifted codeword read from memory are represented by the values of the shifted encoded/decoded portion of the codeword written to memory. This corrected data can include correct values of all of the shift data, user data, and meta data. Then, the encoded/decoded portion of the shifted codeword can be circularly shifted to recover the original data of the unshifted codeword. For instance, the logic 0 of the shift data can be shifted back to its original position. At the same time, the leading 1s in the shift data portion of the encoded/decoded portion of the codeword can be restored to their original positions and the user data and meta data portions can also be restored to their data patterns prior to being shifted.

The probability of a hard error occurring in a memory can depend on a bit error rate and a codeword size. The bit error rate can represent a percentage of bits of a data stream that are altered due to noise, interference, distortion, bit synchronization errors, the like, or any combination thereof. The probability of encountering a certain number of errors was evaluated for various codeword sizes and bit error rates, assuming a randomized data pattern.

To implement an internal ECC scheme for the shift data, n shift digits of a codeword can be allocated to shift data, where n is an integer. Adding additional digits for shift data can increase stored data. Tradeoffs between using different amounts of the n additional digits for shift data versus parity protection were evaluated. In an example with 256 bits of user data and a bit error rate of $1 \times 10^{-4}$, reducing error correction capability by 1 bit and assigning at least the 1 bit to the shift data was found to provide significant benefit to the codeword error rate. Allocating the first few digits to shifting rather than parity were found to provide the biggest improvements for the internal ECC scheme shown in FIG. 4. Thus, in the example of FIG. 4, 3 digits were allocated to shift data. In certain embodiments, 1, 2, 3, 4, 5, or more digits can be allocated for shift data in accordance with the internal ECC scheme. Allocating more circular shifting digits should be more advantageous when using external ECC protection for user data, for example, as will be described later in more detail in connection with FIG. 7.

The methods of fixing hard write time errors described herein are based on probabilistically being able to correct for hard errors during write time. The solutions described herein can be scaled to increase correctability of errors. For example, an increasing number of digits can be assigned to implementing shift data in an internal ECC scheme. Moreover, ECC can be internal or external. In the case of internal ECC, more than 1 bit error correction can be made.

Figure 5:
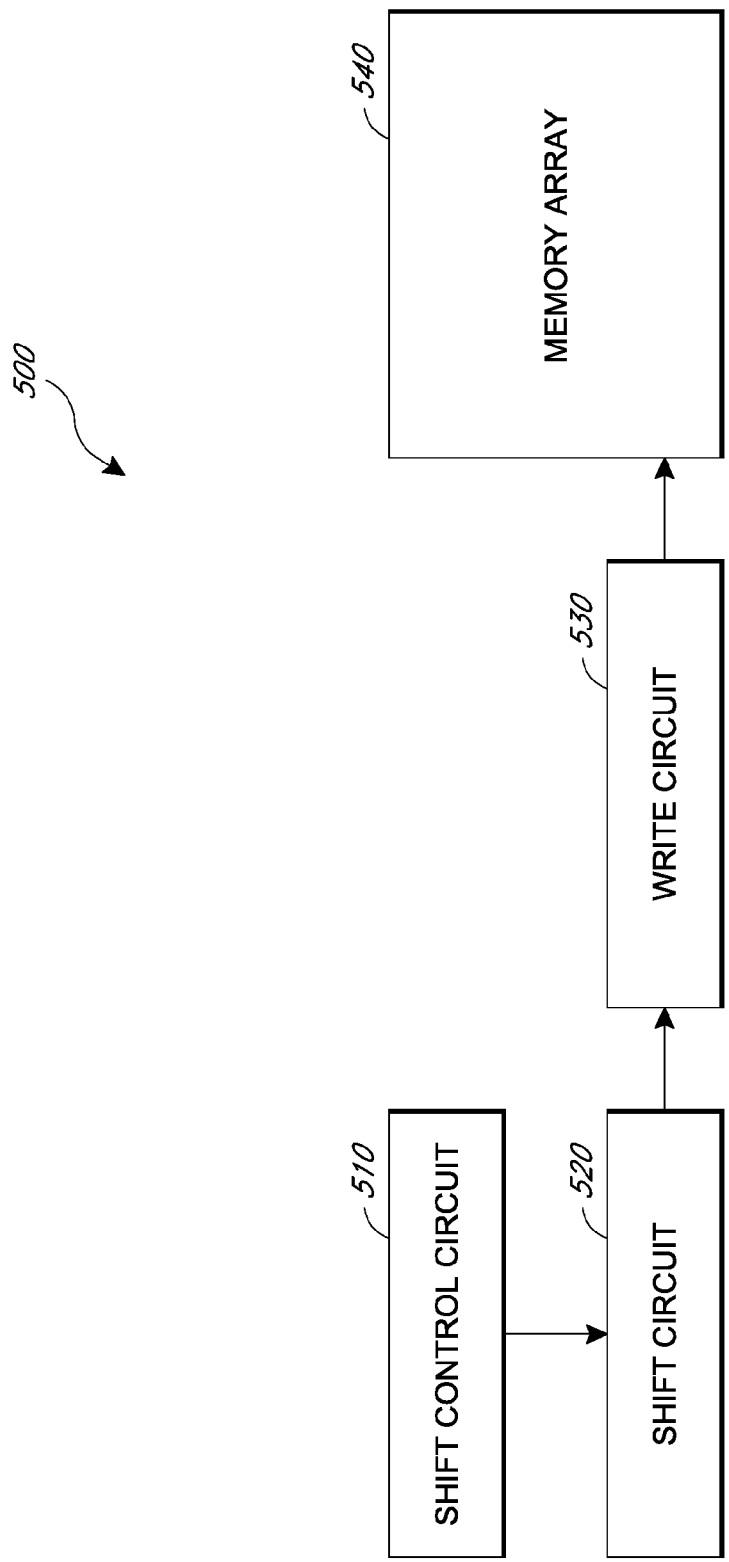
FIG. 5 illustrates a block diagram of an electronic system that can shift write data according to an embodiment.

The methods of correcting hard write time errors described herein can be implemented by a wide variety of hardware. FIG. 5 illustrates a block diagram of an electronic system 500 that can shift write data in accordance with the principles and advantages described herein. Accordingly, the electronic system 500 can be used to implement some or all of the functionalities described above in connection with the methods of FIGS. 1A-1B and the examples of correcting for hard errors described with reference to FIGS. 2A-2D. As illustrated in FIG. 5, the electronic system 500 can include a shift control circuit 510, a shift circuit 520, a write circuit 530, and a memory array 540. It will be understood that the electronic system 500 can include more or fewer elements according to various embodiments. In certain embodiments, the system 500 can be implemented on a single die or integrated circuit.

The shift control circuit 510 can control the shift circuit to cause a string of data, such as a codeword, to be shifted in the shift circuit 520 based on error data indicative of one or more hard errors corresponding to one or more selected memory cells of the memory array 540 and value(s) associated with the one or more hard errors. This can shift the data to be programmed to the memory array 540 to match a value of a digit in the string of write data to be programmed the selected memory cell with the value associated with the hard error. The shift control circuit 510 can generate shift data indicative of an amount by which the shift circuit 520 shifted the string of write data that is stored in the memory array. In certain embodiments, the shift control circuit 510 can generate parity data for the shift data. The shift control circuit 510 can implement addition functionalities, such as determining whether the number of errors satisfies a threshold number of errors and/or determining whether all hard error(s) are correctable. The shift control circuit 510 can be implemented by any suitable circuitry, such as combination logic.

Figure 6:
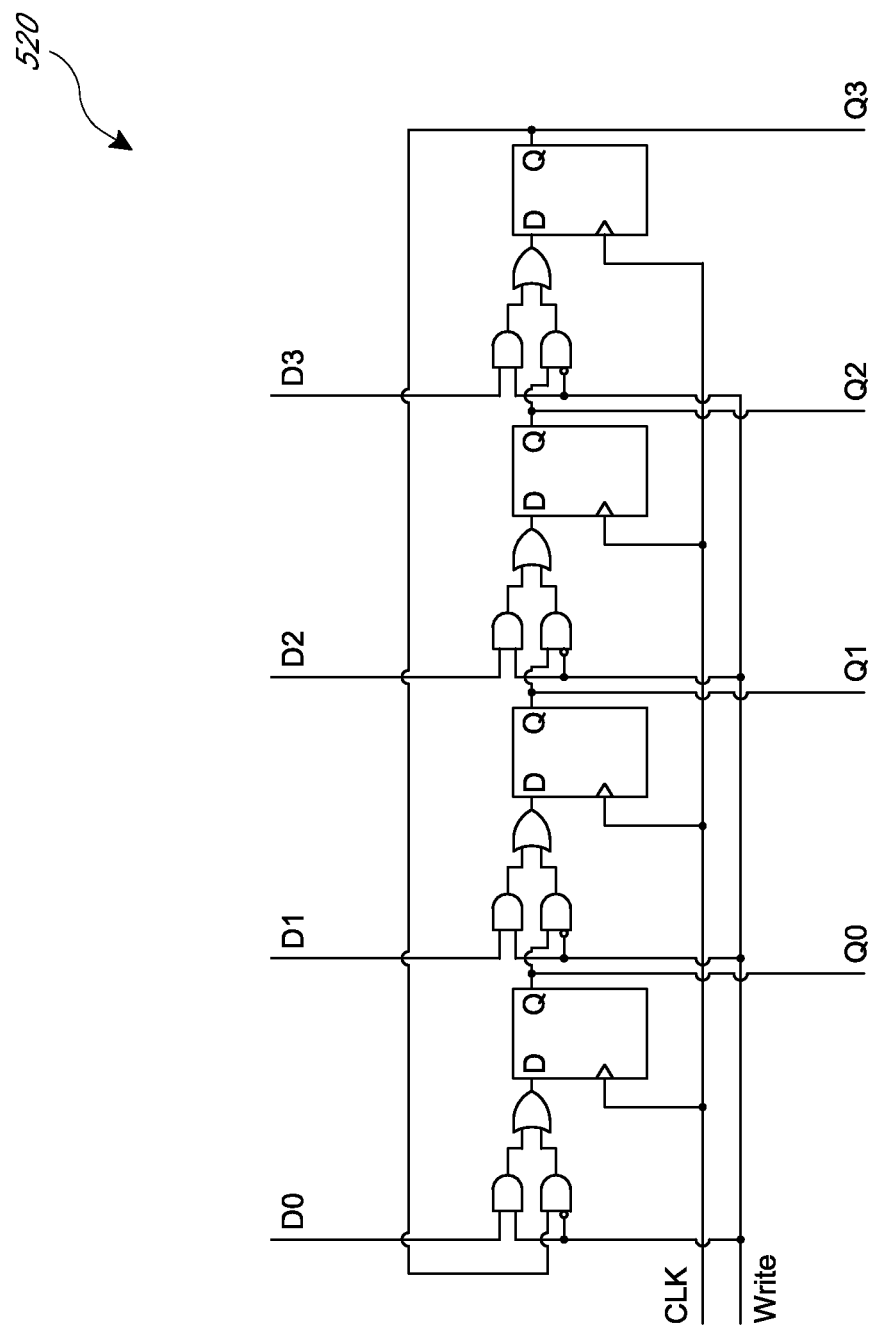
FIG. 6 illustrates one embodiment of a shift control circuit.

The shift circuit 520 can shift a string of data to implement any combination of features of the shifting described herein. For instance, the shift circuit 520 can include a linear shift register. One example shift circuit 520 is illustrated in FIG. 6. The shift circuit 520 of FIG. 6 circularly shifts a data string. When the write signal is asserted (that is, at a logic 1 in this example), data signals D0-D3 are latched by the corresponding state elements of the shift register. The state elements can be D-type flip-flops as illustrated or any other suitable state elements. After data is written to the state elements, the write signal is deasserted (that is, at a logic 0 in this example). During the next clock cycle, the data signals latched by the state elements are output of the state elements as output signals Q0-Q3. In subsequent clock cycles, the data can be circularly shifted through the shift register or new data can be written to the state elements, responsive to whether the write signal is asserted or deasserted. When the write signal is deasserted write data can be shifted through the shift register. Thus, the write signal can be thought of as a not shift signal. On the other hand, when the write signal is asserted new data can be written to the state elements corresponding to the values of the data signals D0-D3. Although the shift circuit 520 of FIG. 6 is configured to shift 4 digits of data, it will be understood that a functionally similar circuit can be implement to shift any suitable number of data digits.

In some other embodiments, a shift circuit can implement a non-circular shift. Such non-circular shifting can rearrange the data pattern of FIG. 2D such that the data as written matches all of the hard errors in the memory cells. An example non-circular shift circuit can scramble data digits according to a pre-defined pattern. For instance, positions of adjacent even and odd bits can be switched. Thus in a four bit example, bits 0 and 1 can be swapped and bits 2 and 3 can be swapped. In another example, the shift circuit 520 of FIG. 6 can be modified to implement non-circular shifts. For instance Q3 can be connected to D2, Q2 can be connected to D0, Q0 can be connected to D1, and Q1 can be connected to D3. A predefined set of possible connections and/or different shift circuits can be implemented, and one of the one of the predefined set can be selected to reduce and/or minimize hard errors.

Referring back to FIG. 5, after each shift, the shift control circuit 510 can compare the data stored by the state elements to values of the hard error(s) associated with corresponding memory cells in the memory array 540 that the data is to be programmed. Shift data identifying the amount by which the original data is shifted can be stored in connection with each shift. The number of digits that do not match values associated with the hard error(s) in corresponding memory cells can be stored in connection with each shift.

When a string of data is shifted by the shift circuit 520 such that all hard errors will be masked or the maximal number of hard errors will be masked, the write circuit 530 can program the shifted data string to the memory array 540. For example, in one embodiment, the write circuit 530 can receive outputs Q0-Q4 of the state elements of FIG. 6 and then program corresponding data to the memory array 540.

The memory array 540 can include any suitable array of memory elements. In one embodiment, the memory array can include PCM cells. PCM cells can be advantageous, for example, due to being able to switch values (for example, logic 0 to logic 1, or logic 1 to logic 0) without a separate erase operation, not needing a constant power supply, having relatively fast read access times, being scalable, or any combination thereof. The memory array can be embodied on a single die or integrated circuit.

In certain electronic systems, such as PCM based Peripheral Component Interconnect Express (PCIe) systems, a system codeword is constructed from multiple codewords from different die and additional ECC parity symbols. In such systems, the system codeword can be protected by additional ECC parity symbols generated by an ECC encoding engine that is external to the die storing the components of the system codeword. In some of these systems, there is an option to turn on-die ECC encoders/decoders on or off. When implementing data shifting described herein in such systems, shift data could be stored on one die and the user data components of the system codeword can be stored on one or more separate die.

Figure 7:
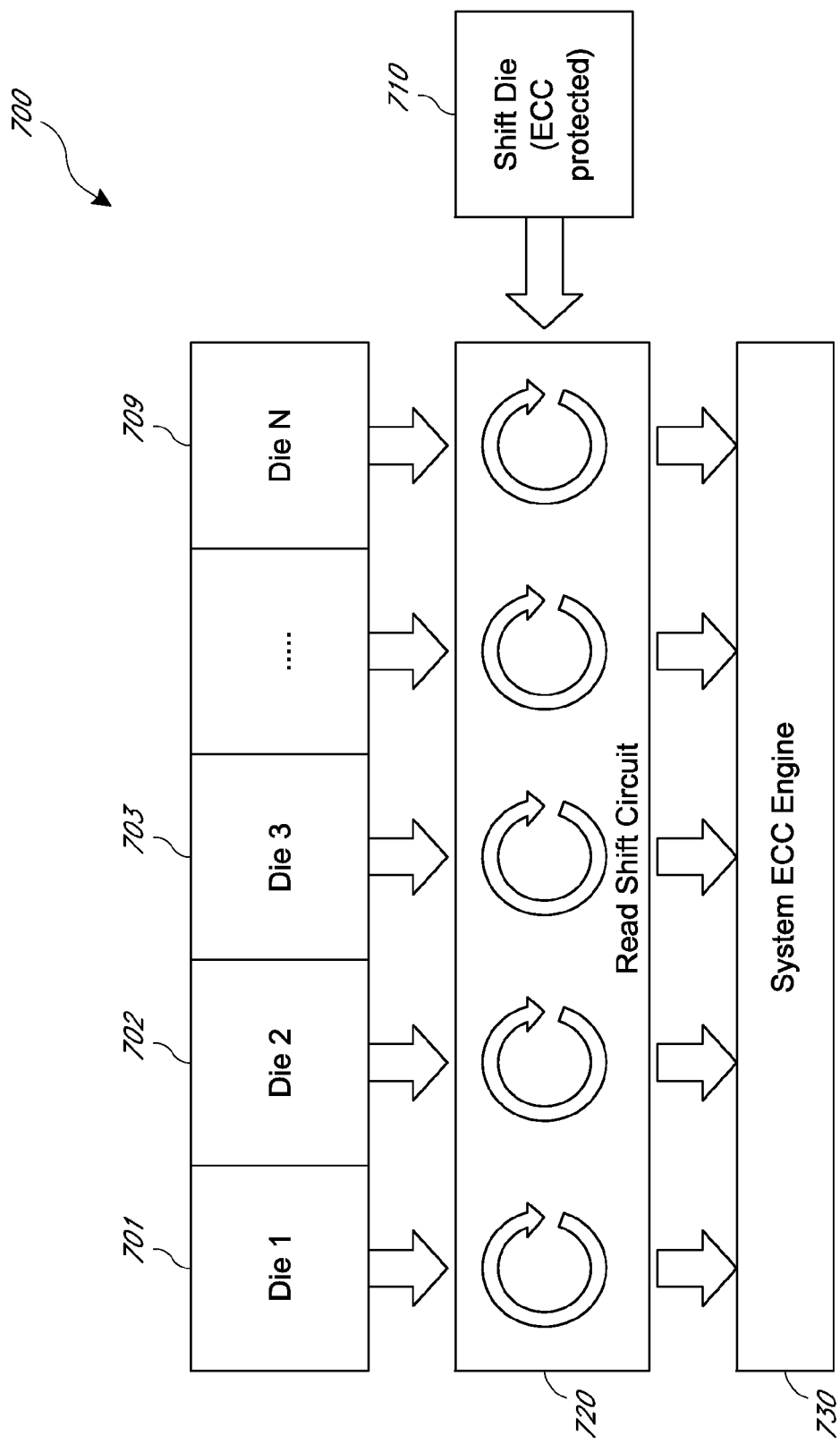
FIG. 7 illustrates an example of an electronic system with a separate die for storing shift data according to an embodiment.

FIG. 7 illustrates an example of an electronic system with a separate die for storing shift data according to an embodiment. The electronic system 700 can include a plurality of die 701-709 to store user data and another die 710 to store shift data indicative of amounts by which portions of the system codeword stored on one or more of the die 701-709 are shifted. Each of the die 700-710 can include a memory array 540. In some embodiments, each of the die 700-710 can include the electronic system 500. The die 700-710 can be substantially the same according to certain embodiments, but each die is configured differently (for example, coupled to different external circuit elements). In one embodiment, an internal ECC encoder/decoder is activated for only the die 710 storing the shift data. When the on-die ECC encoder/decoder is activated on the die 710, the shift data can be corrected on the die 710 prior to being transmitted from the die 710. Statistically, a typical codeword of shift data is expected to have a relatively small amount of errors for a reasonable bit error rate in certain applications. Accordingly, on-die ECC should be sufficient to meet a target bit error rate in such applications.

A read shift circuit 720 can receive portions of a system codeword from one or more of the plurality of die 701-709 and shift data from the other die 710. The other die 710 can store shift data for a number of other die. For example, the die 710, can store shift data for 2, 4, 8, 16, 32, or more die. A codeword read from the other die 710 can include shift data for each of the plurality of die 701-709 in one embodiment. The shift data can be error corrected on the die 710 by an ECC decoder prior to being sent to the read shift circuit 720. In this way, the data read from the die 701-709 can be shifted by the read shift circuit 720 based on shift data that has already been error corrected. The shift data can then be used to shift the codewords that make up the system codeword before passing through the system level ECC encoding/decoding engine 730 that is external to the die 700-710. The read shift circuit 720 can shift the codewords read from one or more of the die 701-709 back to an unshifted form based on the shift data, in which the unshifted form corresponds to the data prior to being shifted to match hard error(s) in memory. The system level ECC engine 730 can include an ECC decoder to correct errors in data shifted by the read shift circuit 720. Alternatively, the ECC corrected shift data can be used to shift the codewords that make up the system codeword after passing through the system level ECC engine 730 in some other implementations.

In one embodiment, a method of programming data to a memory array includes determining a hard error corresponding to a selected memory cell of the memory array and a value associated with the hard error. The method also includes shifting a data pattern to be programmed to generate a shifted data pattern such that a value to be stored by the selected memory cell matches the value associated with the hard error. In addition, the method includes programming the shifted data pattern to the memory array, wherein the value written to the selected memory cell matches the value associated with the hard error.

In another embodiment, an apparatus includes a memory array, a shift circuit, a write circuit, and a shift control circuit. The memory array memory array includes a plurality of memory cells configured to store data. The shift circuit is configured to shift a string of data. The write circuit is configured to program data shifted by the shift circuit to memory cells of the memory array. The shift circuit is configured to cause the string of data to be shifted in the shift circuit based on data indicative of a hard error corresponding to a selected memory cell of the memory array and a value associated with the hard error, so as to match a value of a digit in the string of data to be programmed to the selected memory cell with the value associated with the hard error. The shift circuit is also configured to generate shift data indicative of an amount by which the shift circuit shifted the string of data string programmed to the memory array.

In yet another embodiment, a system includes three die and a read shift circuit. The first die includes a first memory configured to store at least a portion of a first codeword. The second die includes a second memory configured to store at least a portion of a second codeword. The third die includes a third memory and an on-die error correction code decoder. The third memory is configured to store shift data that includes first shift data and second shift data. The first shift data is indicative of an amount by which the portion of the first codeword is shifted in the first memory, and the second shift data indicative of an amount by which the portion of the second codeword is shifted in the second memory. The first shift data and the second shift data are protected by error correction codes. The on-die error correction code decoder of the third die is configured to correct errors in the shift data. The a read shift circuit is configured to shift the portion of the first codeword read from the first memory based on first shift data that has been corrected by the on-die error correction decoder of the third die. The read shift circuit is also configured to shift the portion of the second codeword read from the second memory based on second shift data that has been corrected by the on-die error correction decoder of the third die.

In the embodiments described above, shifting data to correct for hard errors in memory can be performed by any circuit in connection with a memory array. A memory device, such as a PCM memory device, according to the embodiments described above can be incorporated in various electronic devices. Examples of the electronic devices can include, but are not limited to, consumer electronic products, electronic circuits, electronic circuit components, parts of the consumer electronic products, electronic test equipments, etc. Examples of the consumer electronic products include, but are not limited to, a mobile phone, a telephone, a television, a computer monitor, a computer, a hand-held computer, a laptop computer, a tablet computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

Any combination of the features of the methods described herein may be embodied in code stored in a non-transitory computer readable medium. When executed, the non-transitory computer readable medium may cause some or all of any of the methods described herein to be performed. It will be understood that any of the methods discussed herein may include greater or fewer operations and that the operations may be performed in any order, as appropriate.

Various embodiments have been described above. Although described with reference to these specific embodiments, the descriptions are intended to be illustrative and are not intended to be limiting. Various modifications and applications may occur to those skilled in the art.

We claim:

1. A system comprising:
   a first die comprising a first memory configured to store at least a portion of a codeword;
   a second die comprising a second memory configured to store shift data indicative of an amount by which the portion of the codeword is shifted in the first memory, the shift data being based at least in part on an indication of a hard error in the first memory; and
   a read shift circuit configured to shift the portion of the codeword read from the first memory based at least partly on shift data.

2. The system of claim 1, further comprising another die that comprises another memory configured to store at least a portion of an additional codeword, wherein the second memory of the second die is configured to store additional shift data indicative of an amount by which the additional codeword is shifted in the another memory.

3. The system of claim 2, wherein a system codeword comprises the codeword and the additional codeword.

4. The system of claim 1, wherein the second die further comprises an on-die error correction code decoder configured to correct an error in the shift data.

5. The system of claim 1, wherein the codeword comprises padded data digits that each have the same value, the padded data digits comprising at least one of leading data digits or trailing data digits.

6. The system of claim 1, wherein the first and second memories each comprise nonvolatile memory.

7. The system of claim 1, wherein the first memory comprises phase-change memory.

8. The system of claim 1, further comprising a system error correction code decoder configured to correct errors in data shifted by the read shift circuit.

9. The system of claim 1, wherein the first die comprises:
a shift circuit configured to shift the portion of the codeword; and
a write circuit configured to program the portion of the codeword shifted by the shift circuit to the first memory.

10. The system of claim 1, wherein the first die comprises:
a shift circuit configured to rearrange the portion of the codeword;
a shift control circuit configured to cause the portion of the codeword to be rearranged by the shift circuit based at least partly on data indicative of a hard error corresponding to a selected memory cell of the first memory, such that a value of a digit in the portion of the codeword rearranged by the shift circuit corresponding to the selected memory cell matches with a value associated with the hard error corresponding to the selected memory cell; and
a write circuit configured to program the portion of the codeword rearranged by the shift circuit to the first memory such that a digit in the string of rearranged data is programmed to the selected memory cell.

11. A system comprising:
a first die comprising a first memory configured to store at least a portion of a first codeword;
a second die comprising a second memory configured to store at least a portion of a second codeword;
a third die comprising a third memory and an on-die error correction code decoder, wherein the third memory is configured to store first shift data indicative of an amount by which the portion of the first codeword is shifted in the first memory, wherein the third memory is configured to store second shift data indicative of an amount by which the portion of the second codeword is shifted in the second memory, and wherein the on-die error correction code decoder is configured to correct errors in the first shift data and second shift data; and a read shift circuit configured to shift the portion of the first codeword read from the first memory based on the first shift data that has been corrected by the on-die error correction decoder of the third die, and the read shift circuit configured to shift the portion of the second codeword read from the second memory based on the second shift data that has been corrected by the on-die error correction decoder of the third die.

12. The system of claim 11, wherein the first and second codewords comprise padded data digits that each has the same value, the padded data digits comprising at least one of leading data digits or trailing data digits.

13. The system of claim 11, wherein the first and second memories each comprise phase change memory cells.

14. The system of claim 11, wherein the first die comprises:
a shift circuit configured to rearrange the portion of the first codeword such that a value of a digit in the portion of the first codeword rearranged by the shift circuit corresponding to a selected memory cell of the first memory matches with a value associated with a hard error corresponding to the selected memory cell; and
a write circuit configured to program the portion of the first codeword rearranged by the shift circuit to the first memory such that a digit in the string of rearranged data is programmed to the selected memory cell.

15. The system of claim 11, wherein the third memory is configured to store shift data associated with 8 or more dies, the 8 or more dies including the first die and the second die.

16. The system of claim 11, further comprising an error correction codes engine configured to correct an error in data shifted by the read shift circuit.

17. A method of reading data comprising:
receiving at least a portion of a first codeword stored on a first memory of a first die;
reading shift data indicative of an amount by which the portion of the first code word is shifted in the first memory of the first die, the shift data being based at least in part on an indication of a hard error in the first memory; and
in response to said receiving and said reading, shifting the portion of the first codeword received from the first memory of the first die based on the shift data.

18. The method of claim 17, further comprising programming additional shift data associated with a plurality of additional dies to the different die.

19. The method of claim 18, further comprising:
shifting the portion of the first codeword on the first die; and
programming the shifted portion of the first codeword to the first memory.

20. The method of claim 17, the method further comprising correcting an error in data shifted by the read shift circuit.

* * * * *